United States Patent [19]
Chien et al.

[11] Patent Number: 5,869,383
[45] Date of Patent: Feb. 9, 1999

[54] HIGH CONTRAST, LOW NOISE ALIGNMENT MARK FOR LASER TRIMMING OF REDUNDANT MEMORY ARRAYS

[75] Inventors: Rong-Wu Chien, Chyai; Kuo-Chang Wu, Taichung, both of Taiwan

[73] Assignee: Vanguard International Semiconductor Corporation, Hsin-Chu, Taiwan

[21] Appl. No.: 971,667

[22] Filed: Nov. 17, 1997

Related U.S. Application Data

[62] Division of Ser. No. 660,304, Jun. 7, 1996.

[51] Int. Cl.$^6$ .................................................. H01L 21/302
[52] U.S. Cl. ......................... 438/401; 438/462; 438/463; 438/700
[58] Field of Search .................................... 438/401, 462, 438/463, 700

[56] References Cited

U.S. PATENT DOCUMENTS

| | | | |
|---|---|---|---|
| 4,992,394 | 2/1991 | Kostelak, Jr. et al. | 437/229 |
| 5,157,003 | 10/1992 | Tsuji et al. | 437/229 |
| 5,241,212 | 8/1993 | Motonami et al. | 257/529 |
| 5,314,831 | 5/1994 | Hirae et al. | 437/8 |
| 5,369,050 | 11/1994 | Kawai | 437/62 |
| 5,401,691 | 3/1995 | Caldwell | 437/228 |
| 5,500,392 | 3/1996 | Reynolds et al. | 438/401 |
| 5,668,030 | 9/1997 | Chung et al. | 438/401 |
| 5,691,232 | 11/1997 | Bashir et al. | 438/424 |

OTHER PUBLICATIONS

S. Wolf, "Silicon Processing For The VLSI Era"–vol. 2, Lattice Press, Sunset Beach, CA, 1990, p. 275.
S. Wolf, "Silicon Processing For The VLSI Era", vol. 3. Lattice Press, Sunset Beach, CA, 1995, p. 598.

*Primary Examiner*—Peter Toby Brown
*Assistant Examiner*—Edwin Oh
*Attorney, Agent, or Firm*—George O. Saile; Stephen B. Ackerman

[57] ABSTRACT

An improved alignment mark used by a laser trimming tool to locate fuses in an underlying integrated circuit is formed using conventional processing sequences. The design features high resolution and improved low noise characteristics. The alignment mark is etched in a shallow layer over a metal layer rather than in the metal itself. The edges which are sensed by the scanning alignment laser of the trimming tool have their elevated portions external to the alignment mark. The improved design replaces a prior art design in which the metal mark protruded from a deep area in the site region. Debris in deep areas adjacent to alignment marks etched in metal, is avoided by the improved design. The absence of this debris virtually eliminates noise in the alignment scan thereby greatly reducing alignment errors.

7 Claims, 5 Drawing Sheets

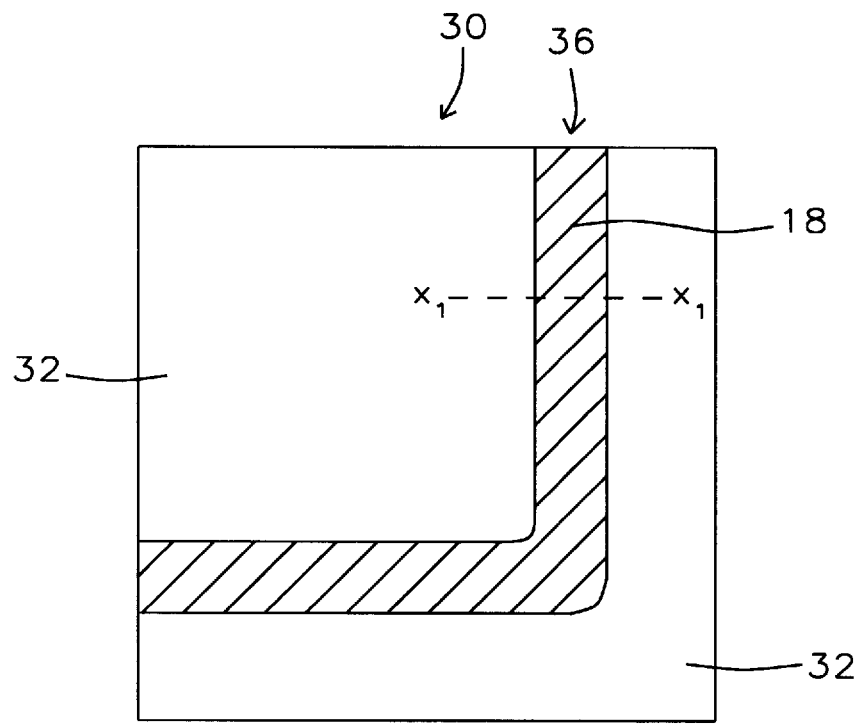
FIG. 1 – Prior Art
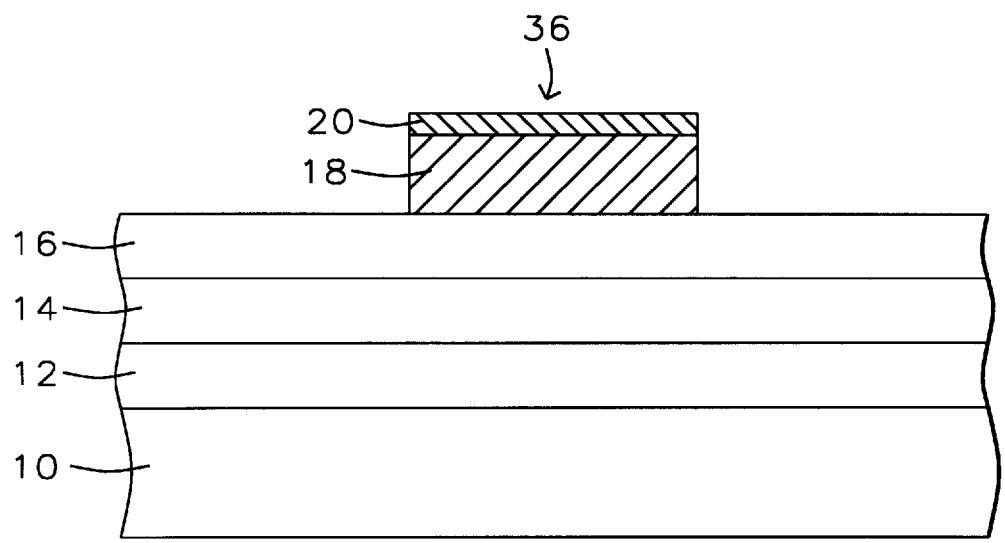
FIG. 2 – Prior Art

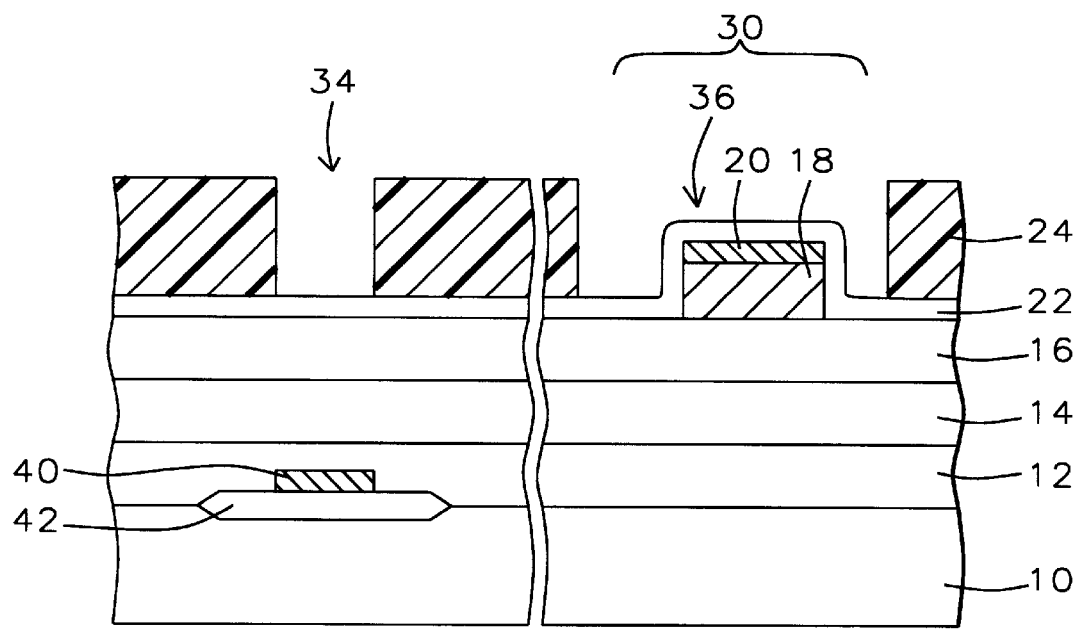
FIG. 3 – Prior Art
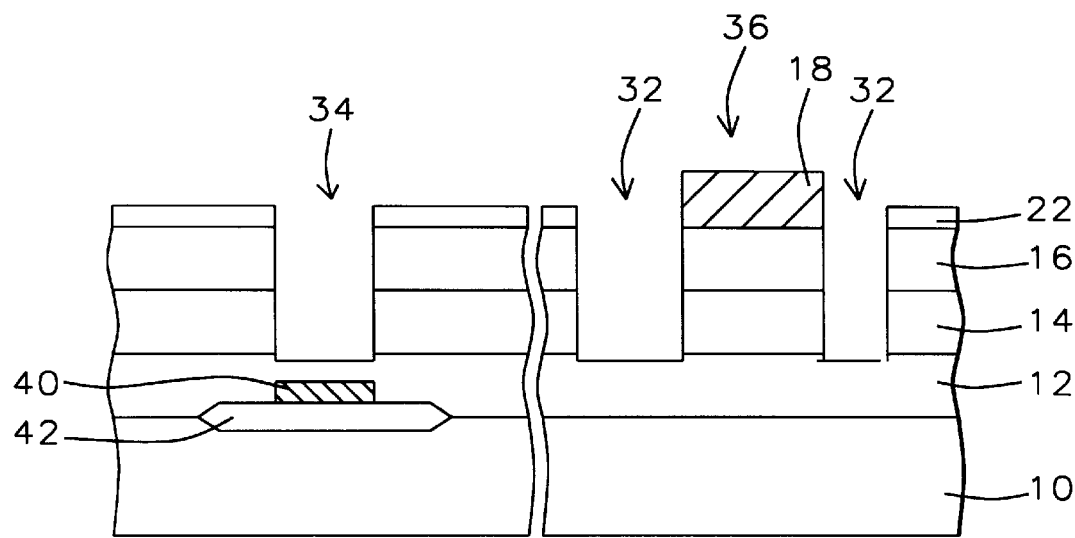
FIG. 4 – Prior Art

HIGH CONTRAST, LOW NOISE ALIGNMENT MARK FOR LASER TRIMMING OF REDUNDANT MEMORY ARRAYS

This is a division of Ser. No. 08/660,304 pending, filing date Jun. 7, 1996, which is assigned to the same assignee as the instant invention.

BACKGROUND OF THE INVENTION (1) Field of the Invention

The invention relates to processes for the manufacture of semiconductor devices and more particularly to processes for managing redundancy in memory arrays.

(2) Description of Prior Art

Computer memory chips consist of vast arrays of storage cells which can be addressed by wordlines and bitlines. Each cell corresponds to one bit. The most commonly used cell design used in current dynamic random access memories (DRAMs) comprise a transfer gate(usually an MOS field-effect-transistor (MOSFET) and a storage node consisting of a capacitor. DRAM cells are, by necessity of high density and of simple design. To this end, the MOSFET-capacitor combination serves quite well. Static-random-access-memories (SRAMs) are slightly more complex, requiring four to six MOSFETs per cell.

The cell quantity requirements for memory are increasing at a phenomenal rate. Whereas the SRAMs of 1991 were of the order of 4 megabits, the density by the year 2001 is predicted to be 256 megabits or more. DRAMs have even greater cell density requirements. See eg. S. Wolf, "Silicon Processing for the VLSI Era", Vol.II, Lattice Press, Sunset Beach, Calif. (1990) p.598ff, and Vol.III(1995) p.275. The occurrence of a single defect in such a complex integrated circuit(IC) renders the entire body useless.

Obviously, the manufacturing functional yield of memory chips would rapidly approach zero if steps were not taken to circumvent such defective components. To this end, additional segments of memory circuits are provided on the IC chip as replacements for defective segments. Fortunately, memory arrays, by virtue of their repetitive design, lend themselves particularly well to the incorporation of such redundant segments. Although, additional space is required for these extra circuits, the yield benefits they provide make them very cost effective.

The manner in which these redundant segments are utilized and defective segments deleted is accomplished by means of laser trimming(LT). A description of the design layout and implementation of such redundant circuits need not be given here but may be found in Motonami et.al., U.S. Pat. No. 5,241,212. The segments are provided with fusible links or fuses which are blown as required, by a laser, after IC processing has been completed and functional testing with probes is possible. The functional testing determines which segments are defective and a laser, usually a neodymium YAG laser, is directed at the appropriate fusible links, thereby breaking the circuit.

The fusible links are formed as part of one of the metallization layers of the IC. Typically, a lower level, such as a polysilicon level is used. This level would, for example, contain the word-lines of a DRAM array. Prior to LT, the interlevel dielectric layers above the fusible link are sometimes removed entirely and replaced by a thinner protective layer to provide a short uniform path for the laser and confine the resultant debris. In other cases, the thick dielectric layers are etched down to a pre-determined thickness above the link. The laser energy required to blow the fuse is proportional to the thickness of the dielectric material above the fuse.

The laser spot is typically about 5×5 microns in size and its target opening at the fusible link is of the order of less than 10 microns. The positioning of the laser is determined by referencing one or two "L" shaped alignment marks located on a top layer of the die. These alignment marks are precisely located with respect to the lower level fusible links by conventional photolithographic alignment techniques familiar to those skilled in the art. Caldwell, U.S. Pat No. 5,401,691 discusses such techniques for the accurate propagation of alignment marks through the various processing levels including those involving chemical-mechanical-polishing(CMP) planarization. Another variation for assuring propagation of alignment marks during processing of ICs is given by Barber and Mayernik, U.S. Pat No. 5,314,837.

Kostelak, U.S. Pat. No. 4,992,394 provides means for enhancing the contrast of alignment marks for use with electron-beam lithography.

The alignment mark itself, is "L" shaped; the perpendicular legs of the "L" coinciding with the x and y axes of the IC arrays. In a prior art configuration shown in FIG. 1, the mark 36 is formed from the metal layer 18, typically an Al/Cu/Si Alloy. The mark is patterned in a square or rectangular site 30 located in the saw-kerf region of the wafer.

A cross section of the mark 36 at the region designated by X1—X1 in FIG. 1, is shown in FIG. 2. Layered upon the silicon wafer 10 under the mark, are the interlevel-dielectric layers(ILD1) 12 and (ILD2) 14. In the IC regions, ILD1 12 separates a first and a second polysilicon level. A first metallization level resides over ILD2 14 and a second metallization layer 18 is atop the inter-metal-dielectric layer (IMD) 16. By process design, these same dielectric layers also reside over the multiple fusible links which participate in the redundancy arrangements. For the purpose of this discussion an IC design using two polysilicon and two metallization levels is used for illustration. For ICs having more than two levels, the discussion deals with the uppermost two metallization levels. Thus the alignment marks are formed within the last interconnection level.

In order to provide a mark with a sharp edge profile, an anti-reflective-coating(ARC) 20 has been applied over the metal layer in which the mark is formed. This typically consists of a layer of titanium nitride(TiN) between about 200 to 800 Angstroms thick. This material is deposited over the metal layer 18 prior to the metal lithography to prevent radiation from the photoresist exposure from reflecting off the metal and exposing resist outside of the designated pattern. The photoresist mask is next applied, patterned and the ARC and metal layers are etched by reactive-ion-etching (RIE) using $BCl_3$ for the TiN and $Cl_2$ for the Al alloy to form the "L" shaped alignment marks.

Referring now to FIG. 3, there are shown together, a cross section of the wafer in the region of a polysilicon fuse 40 and a corresponding cross section in the area of the alignment mark 36. The fuse 40, in this example, is a portion of a word-line which lies over a region of field isolation 42. The wafer has been processed to a point where a second metallization layer 18 and an ARC layer 20 have been patterned over the IMD layer 16. The alignment mark 36 is formed from the ARC layer 20 and the metallization layer 18.

A passivation layer 22 of between about 2,000 to 10,000 Angstroms of silicon oxide or silicon nitride is deposited over the wafer. Photoresist 24 is applied to define the window outline 30 of the alignment mark as well as the access opening to the fuse 34.

Referring now to FIG. 4, Reactive-ion-etching using tetrafluoromethane($CF_4$) alone or in combination with trifluoromethane($CHF_3$), in an argon carrier gas, is used to etch the fuse openings through the passivation layer 22 and the various ILDs(12–16) to within about 3,000 to 5,000 Angstroms over the subjacent polysilicon fuse 40. The residual dielectric material serves to contain the debris from the blown fuse. During this etch the regions 32 of the alignment site 30 are also deeply recessed as shown in FIG. 4. The deep recessions harbor residues and other debris which are difficult to remove. These residues result primarily, from the processing of an additional passivation layer of polyimide which is applied and patterned with photoresist after the deep recessions are formed. Such final processing must be completed before the wafer can be tested in order to determine where the laser trimming is to be applied.

Topographic irregularities caused by the residues interfere with the functionality of the alignment mark as is illustrated in FIG. 5. In this figure there is shown the effect of a defect or particle 50 in the region adjacent to the alignment mark on the laser scanning signal which seeks the edges of the alignment mark for calibration of the LT tool. The alignment laser travels along the path indicated by the line Y1-Y2 shown in FIG. 5A. The defect 50 is located in this path. The corresponding scan, shown in FIG. 5B contains an unwanted peak PX caused by the defect. Peaks P1 and P2 are produced by the edges E1 and E2 of the alignment mark 18. The apparatus aligns itself to a central point CP between the peaks P1 and P2.

The presence multiple defects in the region of the alignment scan can cause extraneous "noise" in the laser scan resulting in serious alignment errors.

Kawai, U.S. Pat No. 5,369,050 provides a method for forming a raised alignment mark having a groove around it. The groove provides the necessary step for sensing the mark. Tsuji and Haraguchi, U.S. Pat No. 5,157,003 discuss the formation of an alignment mark having greater depth than surrounding device areas etched in the same process step. They accomplished this by using two masking steps on the same photoresist pattern.

In each of the two preceding cases the prior art process did not provide for a sufficient alignment mark step to be adequately detected. In the present case, the prior art process provides far too great a step.

SUMMARY OF THE INVENTION

It is an object of this invention to provide an improved design for a noise free alignment mark for use by a laser trimming tool. The mark consists of an "L" shaped opening in a thin layer lying over a metal layer. The novel design avoids the presence of exposed dielectric layers which occur adjacent to alignment marks patterned in the metal. The etching of the dielectric layers to form the access openings to fuses does not result in deep depressions adjacent to the alignment mark. Consequently, residues and debris in these depressions, which cause severe noise in the laser alignment scan, are avoided.

This object is accomplished by etching the alignment mark pattern in a passivation layer and the ARC layer above the metal rather than etching the pattern in the metal layer itself. The dielectric layers near the alignment mark are thus never exposed to the subsequent etching step and the area surrounding the mark is protected by photoresist. Avoidance of the deep depressions eliminates the occurrence of topographic defects in the scanning path of the tool's alignment laser which, in turn, eliminates the noise peaks in the alignment scan.

The novel design permits the alignment marks to be formed by the same RIE step that forms the deep access openings over the fuses. No process changes are required.

BRIEF DESCRIPTION OF THE DRAWINGS

FIG. 1 is a top view of a prior art alignment mark.

FIG. 2 is a cross section of a wafer in the region of a prior art alignment mark.

FIG. 3 and FIG. 4 are a cross sections of a prior art process for forming alignment marks and laser access opening for laser trimming operations.

DESCRIPTION OF THE PREFERRED EMBODIMENTS

A preferred embodiment of this invention and the method for its manufacture will be described in greater detail. The improved structure of this alignment mark will become apparent during the discussion of the method of its formation.

A p-doped <100> oriented monocrystalline silicon wafer substrate is provided. The wafer is processed using conventional DRAM manufacturing procedures for the incorporation of semiconductor devices within the wafer and multiple layers of interconnection metallurgy over its surface. The IC design for this embodiment comprises a DRAM array having one or more redundant segments in a region adjacent to the primary memory array. Fusible links(fuses) are provided for each replaceable segment in the primary array and fuses to insert redundant segments are similarly provided. The fuses in this embodiment are formed in a first polysilicon layer where they consist of sections of word lines in the DRAM array.

Figure 5A:
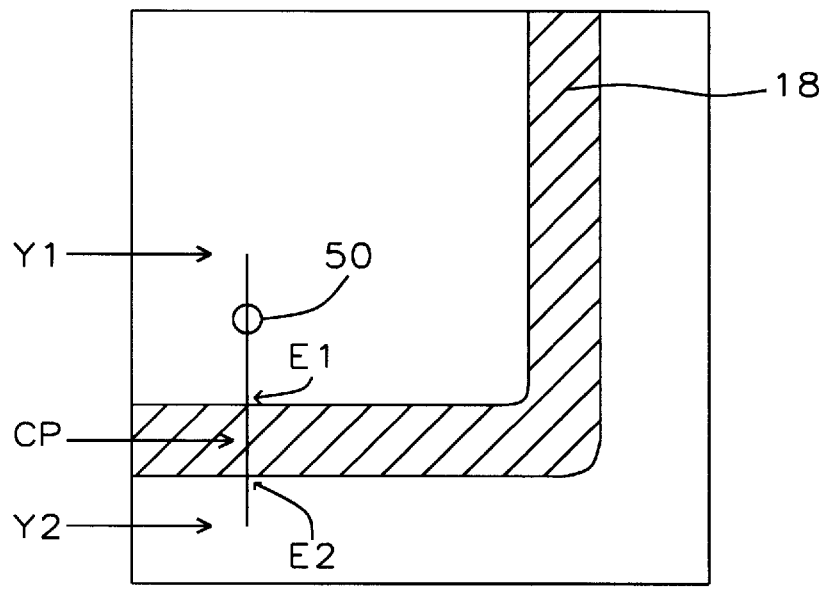
FIG. 5 shows the effect of topological defects in the scanning path of a laser sensing an alignment mark.
Figure 5B:
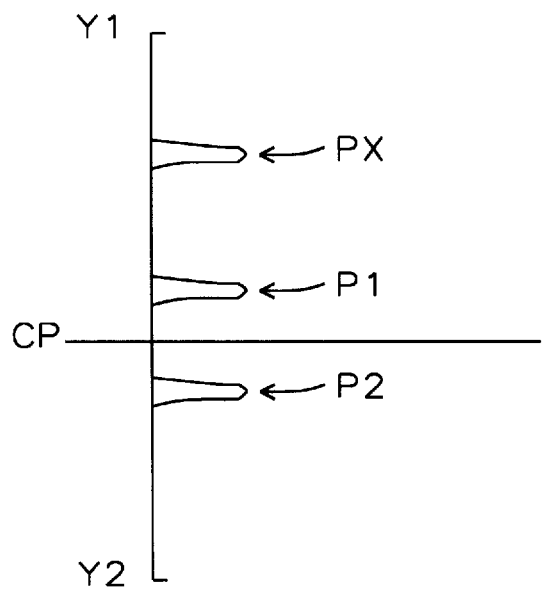
Figure 6:
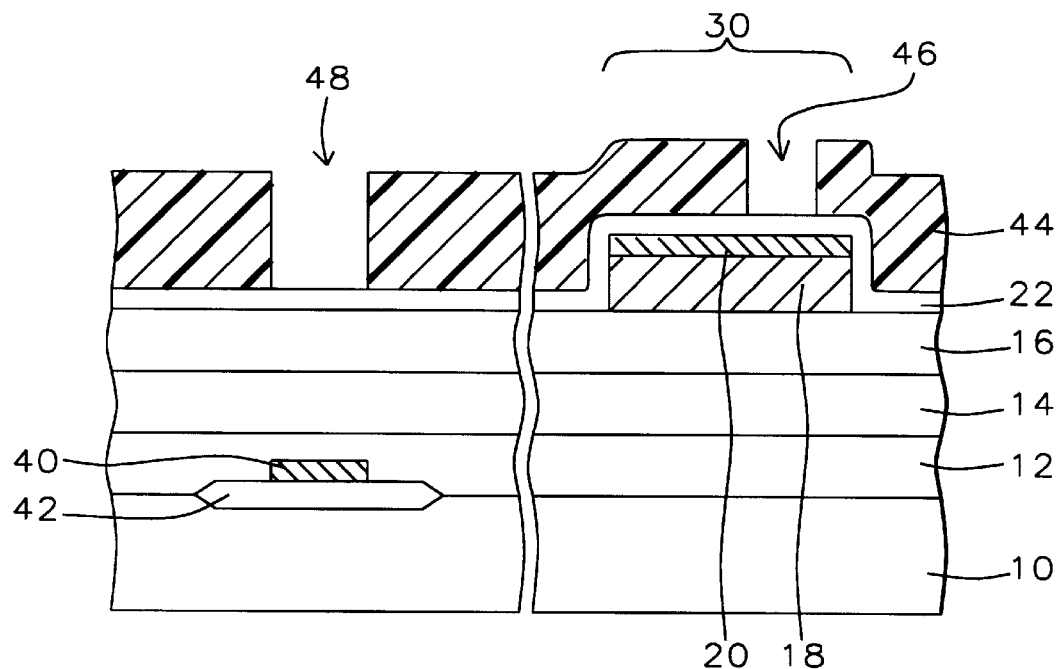
FIG. 6 and FIG. 7 are cross sections of a wafer during processing steps, showing the region of the novel alignment mark and a region over a fuse in an IC.

Referring now to FIG. 6, there is shown a cross section of a wafer 10 having ILD layers 12 and 14 and an IMD layer 16. The fuse 40, of this embodiment, is a portion of a word-line which lies over a region of field isolation 42. The wafer has been processed to a point where a second metallization layer 18 covered by an ARC layer 20 of TiN about 500 Å thick has been patterned over the IMD layer 16. The patterned metallization layer 18 occupies the entire area of the alignment mark site 30 thereby forming a square pad having the outline of 30 in FIG. 8.

A passivation layer 22 of about 2,000 Angstroms of silicon oxide is deposited over the wafer. Alternately, silicon nitride could be used for this layer. Photoresist 44 is applied and patterned to define the alignment mark opening 46 and the access opening 48 to the fuse 40.

Figure 7:
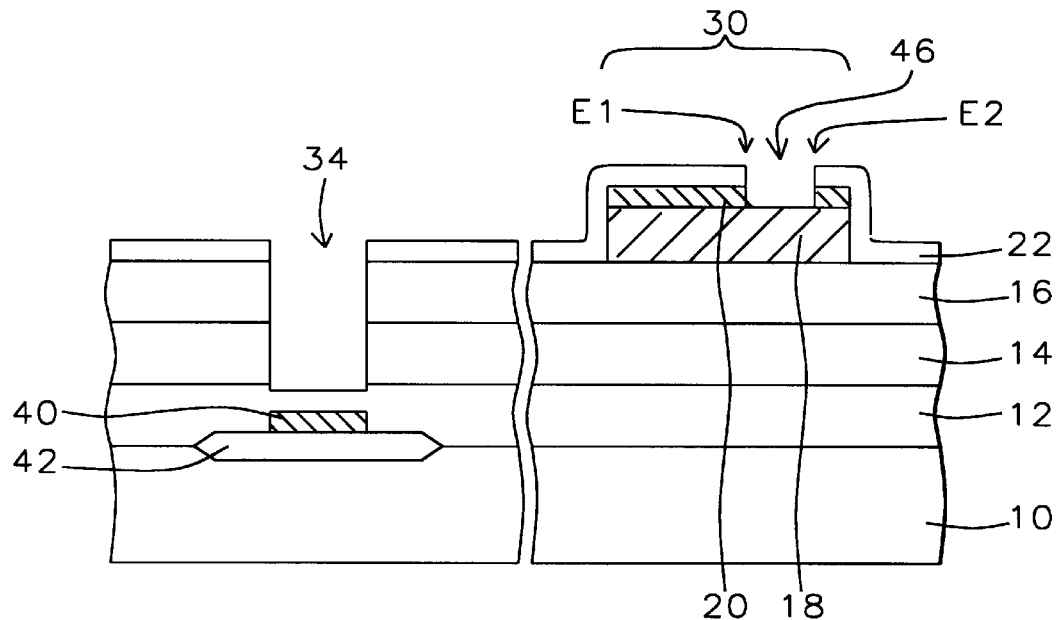

Reactive-ion-etching using $CF_4/Ar$ or $CF_4/CHF_3/Ar$ under conditions providing vertical walled openings, forms the openings shown in FIG. 7. The access opening 34 for the fuse 40 is about 2.5 to 3.0 micrometers deep.

Because of the large etch rate difference between the metal layer and the silicon oxide ILD layers, the over-etch of the approximately 1 micrometer thick aluminum in the opening 46 is only about 300 to 500 Angstroms. By using a thicker ARC layer 22 this over-etch can be minimized. A thicker ARC layer 22 provides improved contrast to the alignment mark during the laser scan. However, the thickness balance that can be achieved must be governed by the specified etch depth of the ILD layers and the assurance of thoroughly exposing the metal surface 36.

The alignment mark 36 contained within the opening 46 has aluminum metal as its surface, as did the prior art alignment mark. However the deep adjacent depressions 32 of FIG. 4 have been eliminated. The edges E1 and E2 which produce the calibration peaks for the laser scan are now formed by the walls of the passivation layer 22 and the ARC layer 20 at the periphery of the metal mark opening 46.

Figure 8:
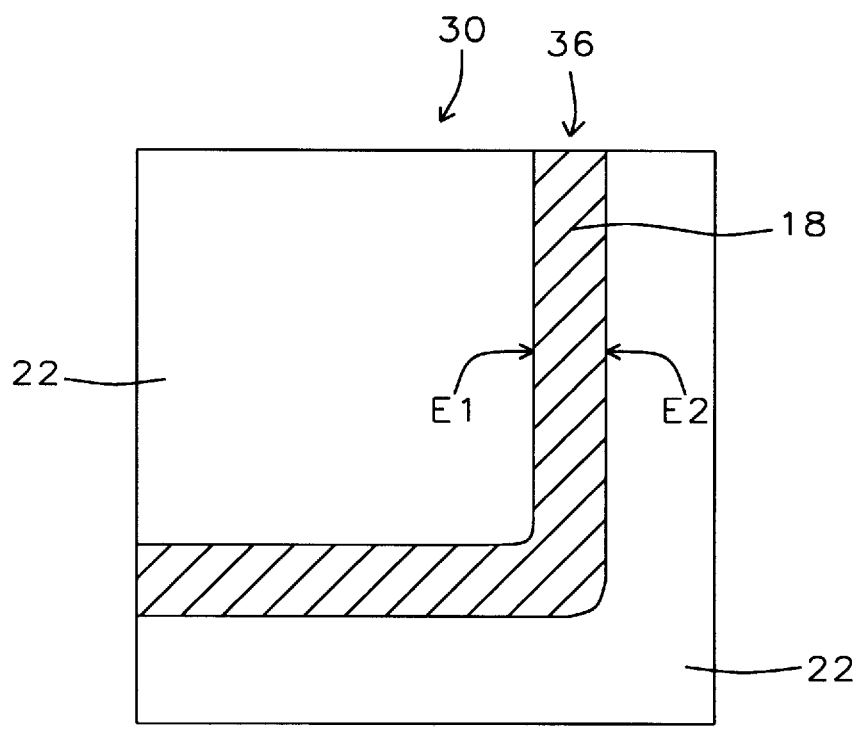
FIG. 8 is a top view of an alignment mark formed according to this invention.

FIG. 8 shows a top view of the alignment mark formed by the design of this invention. Its shape is similar to the that of the prior art alignment mark shown in FIG. 1. However, the regions 32 adjacent to the alignment mark, are no longer recessed but constitute regions elevated above the mark 46 by a step of about 2,500 to 2,800 Angstroms. Debris accumulation in the shallow recess of the alignment mark is negligible and spurious noise peaks in the laser scan are absent. The alignment mark formed by this design has high contrast and a sharpness equivalent to that of the prior art mark.

The embodiment uses a p-type substrate. It should be well understood by those skilled in the art that n-type substrate conductivities may also be used. It should be further understood that the substrate conductivity type as referred to here does not necessarily refer to the conductivity of the starting wafer but could also be the conductivity of a diffused region within a wafer wherein the semiconductor devices are incorporated.

While the preferred embodiment describes the use of fuses formed in a first layer of polysilicon where they address word lines in a DRAM array, it should be understood that such fuses are also applicable under the scope of this invention which may be formed within other circuit levels and which may also address bit line replacements.

Additionally, while this embodiment addresses redundancy in a DRAM array, the applicability of the alignment structure of this invention may be extended to other types of ICs where laser trimming is the used.

While the invention has been particularly shown and described with reference to the preferred embodiments thereof, it will be understood by those skilled in the art that various changes in form and details may be made without departing from the spirit and scope of the invention.

What is claimed is:

1. A method of forming an alignment mark for use as a translational reference by a laser scanning device of a laser trimming tool wherein said alignment mark is formed simultaneously with the formation of access openings to fusible links, comprising:

providing an in-process silicon wafer having an integrated circuit with fusible links and an area designated for an alignment mark covered by an insulative layer;

depositing a metal layer over said wafer;

patterning said metal layer, thereby forming a metal base pad in said area and openings over said fusible links;

depositing an anti-reflective-coating(ARC) layer over said metal base pad;

depositing a passivation layer over said ARC layer;

depositing a photoresist layer over said passivation layer;

patterning said photoresist layer to define an alignment mark over said base pad and openings over said fusible links;

etching said silicon wafer with an anisotropic etching technique, thereby providing said access openings and said alignment mark formed as an opening extending through said passivation layer, through said ARC layer, and terminating at said base pad.

2. The method of claim 1 wherein said ARC layer is titanium nitride and is between about 200 and 800 Angstroms thick.

3. The method of claim 1 wherein said insulative layer is between about 2,000 and 10,000 Angstroms thick.

4. The method of claim 1 wherein said alignment mark consists of two perpendicular stripes emanating from a point over said base pad and terminating at an edge of said base pad thereby forming an "L" shaped mark.

5. The method of claim 4 wherein said perpendicular stripes have a width of between about 10 and 50 micrometers.

6. The method of claim 1 wherein said base layer is a rectangle whose sides are between about 60 and 200 micrometers long.

7. The method of claim 1 wherein said laser scanning device utilizes steps at the edges of said perpendicular stripes to reference position of IC dice proximal to said alignment mark.

* * * * *